(12) United States Patent
Ziegler

(10) Patent No.: US 8,860,531 B2
(45) Date of Patent: Oct. 14, 2014

(54) FILTER HAVING ELECTRICAL CIRCUIT ARRANGEMENT WITH CONCENTRATED ELEMENTS IN MULTI-LAYER SUBSTRATES

(75) Inventor: Robert Ziegler, Traunstein (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 202 days.

(21) Appl. No.: 13/444,510

(22) Filed: Apr. 11, 2012

(65) Prior Publication Data

US 2012/0200372 A1 Aug. 9, 2012

Related U.S. Application Data

(63) Continuation of application No. 12/678,952, filed as application No. PCT/EP2008/008535 on Oct. 9, 2008.

(30) Foreign Application Priority Data

Dec. 5, 2007 (DE) .......................... 10 2007 058 423
Jan. 15, 2008 (DE) .......................... 10 2008 004 470

(51) Int. Cl.
*H03H 7/075* (2006.01)
*H03H 7/42* (2006.01)
*H05K 1/16* (2006.01)
*H03H 7/01* (2006.01)
*H03H 1/00* (2006.01)

(52) U.S. Cl.
CPC .............. *H05K 1/162* (2013.01); *H03H 7/425* (2013.01); *H05K 2201/09236* (2013.01); *H05K 2201/1006* (2013.01); *H05K 2201/09672* (2013.01); *H03H 7/42* (2013.01); *H03H 2001/0085* (2013.01); *H03H 7/0115* (2013.01)

USPC .......................... 333/185; 333/28 R; 333/168

(58) Field of Classification Search
CPC . H03H 7/01; H03H 2001/0085; H03H 7/425; H03H 7/0015; H04B 3/14; H05K 1/162
USPC ........................ 333/28 R, 185, 168
See application file for complete search history.

(56) References Cited

U.S. PATENT DOCUMENTS 4,918,454 A 4/1990 Early et al.
2003/0063427 A1 4/2003 Kunihiro
(Continued)

FOREIGN PATENT DOCUMENTS

DE  1 590 704 A1  6/1970
DE  39 33 552 A1  4/1990
(Continued)

OTHER PUBLICATIONS

Translation of International Preliminary Report on Patentability and Written Opinion dated Jul. 6, 2010.

*Primary Examiner* — Benny Lee
*Assistant Examiner* — Rakesh Patel
(74) *Attorney, Agent, or Firm* — Marshall, Gerstein & Borun LLP

(57) ABSTRACT

An electrical circuit arrangement provides a substrate and at least two conductive surfaces. The substrate comprises at least one layer disposed between the conductive surfaces. The conductive surfaces form a capacitor and overlap in part and form an overlapping area. In the event of a displacement of the conductive surfaces relative to one another, the resulting overlapping area is largely constant up to a threshold value of the displacement.

27 Claims, 9 Drawing Sheets

(56) References Cited

U.S. PATENT DOCUMENTS

| | | |
|---|---|---|
| 2003/0107869 A1 | 6/2003 | Jackson et al. |
| 2003/0141942 A1 | 7/2003 | McMorrow et al. |
| 2005/0200431 A1 | 9/2005 | Lin et al. |
| 2006/0063367 A1 | 3/2006 | Shimada et al. |
| 2006/0092594 A1 | 5/2006 | Hwang et al. |
| 2007/0069835 A1 | 3/2007 | Kamgaing |
| 2007/0222031 A1 | 9/2007 | Jow et al. |
| 2007/0241839 A1* | 10/2007 | Taniguchi .................... 333/185 |

FOREIGN PATENT DOCUMENTS

| | | |
|---|---|---|
| DE | 43 42 818 A1 | 6/1994 |
| DE | 195 40 570 A1 | 9/1996 |
| DE | 198 51 872 A1 | 6/2000 |
| DE | 101 20 271 A1 | 9/2002 |
| EP | 1 170 797 A2 | 1/2002 |
| EP | 1 170 797 A3 | 1/2002 |
| EP | 1 596 478 A2 | 11/2005 |
| EP | 1 596 478 A3 | 11/2005 |
| EP | 1 612 818 A1 | 1/2006 |
| EP | 1 737 283 A1 | 12/2006 |
| FR | 2 260 256 A1 | 8/1975 |
| GB | 1 478 354 A | 6/1977 |
| GB | 2 040 591 A | 8/1980 |
| WO | WO-2006/076607 A1 | 7/2006 |
| WO | WO-2006/132574 A1 | 12/2006 |

* cited by examiner

FILTER HAVING ELECTRICAL CIRCUIT ARRANGEMENT WITH CONCENTRATED ELEMENTS IN MULTI-LAYER SUBSTRATES

CROSS-REFERENCE TO RELATED APPLICATIONS

This is a continuation of U.S. Ser. No. 12/678,952, which is the U.S. national phase of PCT/EP2008/08535 filed Oct. 9, 2008, based on DE 10 2008 004 470.9 filed Jan. 15, 2008 and DE 10 2007 058 423.9 filed Dec. 5, 2007, the entire respective disclosures of which are incorporated herein by reference.

BACKGROUND OF THE INVENTION

1. Field of the Invention

The invention relates to an electrical circuit arrangement with concentrated elements in multi-layer substrates. The invention relates further to a filter, which contains the electrical circuit arrangement.

2. Related Technology

Conventionally, capacitors are realized in circuits as concentrated, discrete components. Accordingly, a high precision of the component tolerances and a reasonable manufacturing cost can be achieved. However, the resulting capacitors occupy a large space and do not always fulfill the requirements for symmetry in an optimum manner. One approach to resolving these problems is the use of integrated capacitors.

For example, DE 195 40 570 A1 discloses an integrated capacitor with a finger structure in a printed circuit board. In this context, two comb-shaped structures interlock with one another on one layer. However, the resulting capacitor is limited in its capacitance value. Furthermore, it requires a large area.

Filter structures with discrete components are conventionally manufactured on printed circuit boards. This generates a large space requirement. Furthermore, the filters are not necessarily adequately symmetrical as a result of the structure of the printed circuit board and the individual components. Through the use of ceramic substrates with integrated inductances and capacitors, the space requirement can be reduced.

Accordingly, US 2005/0200431 A1 discloses a filter on a ceramic multi-layer substrate, which realizes inductances directly as strip conductors on the layers of the substrate. In this manner, it is possible to achieve a reduced space requirement by comparison with printed circuit boards. However, a compensation of production-process-determined tolerances is not achieved. Because of the small dimensions of the strip conductors applied to the levels of the multi-layer substrate, even small displacements of the substrate layers relative to one another have large impacts.

SUMMARY OF THE INVENTION

The invention provides capacitors with low manufacturing tolerance directly on a substrate as concentrated components. Furthermore, the invention provides a filter, which operates without discrete components using concentrated capacitors.

The electrical circuit arrangement according to the invention provides a substrate and at least two conductive surfaces. The substrate comprises at least one layer. At least one layer of the substrate is disposed between the at least two conductive surfaces. The at least two conductive surfaces form a capacitor. The conductive surfaces overlap in part and form an overlapping area. Up to a threshold value of the displacement, the resulting overlapping area is largely constant in the event of a displacement of the conductive surfaces relative to one another. Accordingly, a constant capacitance is guaranteed even in the event of a manufacturing-tolerance-based displacement of the conductive surfaces relative to one another.

The conductive surfaces are preferably formed by metallization of at least the two surfaces of at least one layer of the substrate. Accordingly, conventional manufacturing processes can be used. A safe holding of the conductive surfaces on the substrate continues to be guaranteed in this manner.

At least one of the conductive surfaces is preferably smaller in at least one dimension than at least another of the conductive surfaces. The at least one conductive surface smaller in this dimension is overlapped in this dimension on both sides by the at least one conductive surface larger in this dimension. Accordingly, a displacement of the conductive surfaces relative to one another in this one dimension is possible without significant alteration of the capacitance.

At least one of the conductive surfaces is advantageously smaller in both dimensions than at least another of the conductive surfaces. The at least one smaller conductive surface is advantageously overlapped in both dimensions on both sides of the at least one larger conductive surface. Accordingly, a displacement of the conductive surfaces relative to one another in both dimensions is possible without significant alteration of the capacitance.

The substrate is preferably a multi-layer substrate. The multiple layers are preferably connected by at least one electrically conductive through contact. The circuit arrangement can be manufactured in this manner with a low structural volume. A use of relatively deeper substrate layers is facilitated by means of through contacts.

The electrical circuit arrangement is preferably built up in a symmetrical manner at least relative to one axis. Especially in the case of balanced, in particular, differential circuit arrangements, this leads to an improvement of the high-frequency behavior. Furthermore, manufacture is facilitated.

The substrate is preferably a ceramic substrate or a dielectric printed circuit board. Accordingly, a use of current manufacturing methods is possible.

In each case at least two conductive surfaces are preferably disposed on at least two sides of the at least one layer of the substrate. At least one further conductive surface on one side of the at least one layer of the substrate is preferably allocated to each conductive surface on the other side of the at least one layer of the substrate. The mutually allocated conductive surfaces preferably overlap at least in part and form an overlapping area. The mutually allocated conductive surfaces form capacitors. The at least two capacitors formed in this manner are preferably connected in parallel.

The first conductive surface of the first capacitor and the first conductive surface of the second capacitor is advantageously disposed on the first side of the at least one layer of the substrate. The second conductive surface of the first capacitor and the second conductive surface of the second capacitor is advantageously disposed on the second side of the at least one layer of the substrate. The first conductive surface of the first capacitor is preferably connected to the second conductive surface of the second capacitor. The first conductive surface of the second capacitor is preferably connected to the second conductive surface of the first capacitor. In this manner, through the twofold design of the conductive surfaces, a compensation of production-determined surface tolerances is possible. As a result of the anti-parallel configuration, it can be guaranteed that the parasitic capacitances are identical at both connections relative to equipotential surfaces, for example, earth surfaces. This is particularly important for balanced structures.

The substrate preferably provides at least two layers. At least one conductive surface is preferably disposed in each case on the surfaces of the substrate and between at least two layers of the substrate. At least one further conductive surface is preferably disposed between the two conductive surfaces. The further conductive surface is preferably not connected electrically to the at least two surfaces. The two conductive surfaces and the one further conductive surface not electrically connected to the two conductive surfaces form a capacitor. In this manner, the capacitance can be further enlarged with a constant space requirement.

A filter contains at least one electrical circuit arrangement according to the invention. The filter contains at least one first inductance. The first inductance is spatially concentrated. Accordingly, the spatial extension of the inductance is substantially smaller than the wavelengths of the signals to be processed by the filter. The concentrated inductance is realized as a conductive strip on the substrate. Accordingly, the filter is stable in its properties with regard to a displacement of the substrate layers relative to one another. Furthermore, a very space-saving structure of the filter is achieved through the use of integrated, concentrated capacitances.

The substrate preferably provides several layers. The several layers are preferably connected by means of conductive through contacts. The filter preferably extends over several substrate layers. Accordingly, the space requirement of the filter can be further reduced.

The conductive strip, which forms the at least one inductance, advantageously provides a curve and/or is preferably arranged in a spiral shape and/or a loop shape. In this manner, the inductance of the conductive strip can be raised without increasing the space requirement.

The filter is preferably structured in a largely symmetrical manner relative to at least one axis. This improves the high-frequency properties of the filter, in particular, in the case of balanced signals.

The filter can be a balanced two-port filter. The filter can provide an all-pass characteristic. The filter preferably generates a phase distortion (delayed equalizer). The filter advantageously comprises several inductances connected in parallel by means of capacitors. In this manner, phase-distorted signals can be corrected.

The filter advantageously comprises two inductances connected in parallel by means of two capacitors. The inductances are preferably arranged in a crossover manner. The crossover is preferably implemented by means of conductive through contacts through at least one layer of the substrate. The crossover by means of a through contact is very cost favorable to manufacture, because no further processing steps are required. Additional costs are incurred with an alternative crossover on the substrate surface, for example, with bonding wires.

The filter preferably provides four connections. The first inductance is preferably connected to the first and fourth connection. The second inductance is preferably connected to the second and third connection. The first capacitor is preferably connected to the first and second connection. The second capacitor is preferably connected to the third and fourth connection. The first port of the filter is preferably connected in parallel to the first and third connection. The second port of the filter is preferably connected in parallel to the second and fourth connection. In each case, the two capacitors and inductances preferably provide largely the same size. The balanced high-frequency properties of the filter are improved by the largely symmetrical structure.

The filter is advantageously a differential two-port filter and advantageously provides a low-pass characteristic. Accordingly, high-frequency components of a signal can be filtered out.

The filter preferably comprises several circuit elements connected in parallel by means of inductances, which preferably comprise series circuits of inductances and capacitors. The capacitors are preferably formed by electrical circuit arrangements according to the invention. Accordingly, displacements of the substrate layers relative to one another can be compensated. Furthermore, the space requirement of a filter of this kind is very low. The filter preferably contains three circuit elements. The first port of the filter is preferably connected in parallel to the first circuit element. The second circuit element is preferably connected in parallel to the first circuit element by means of two inductances. The third circuit element is preferably connected in parallel to the second circuit element by means of two inductances. The second port of the filter is preferably connected in parallel to the third circuit element by means of two inductances. The circuit elements preferably comprise series circuits of respectively a first inductance, a capacitor and a second inductance. The capacitors of the second and third circuit element are preferably larger than the capacitor of the first circuit element. The inductances of the second circuit element are preferably larger than the inductances of the first and third circuit element. This structure of the filter allows a uniform frequency response at the same time as a small number of components.

The filter advantageously contains at least one electrical circuit arrangement according to a first embodiment of the invention comprising an electrical circuit arrangement with a substrate and at least two conductive surfaces, wherein the substrate comprises at least one layer, wherein, between the at least two conductive surfaces, at least one layer of the substrate is disposed, the at least two conductive surfaces form a capacitor, and wherein the conductive surfaces overlap at least in part and form an overlapping area wherein the resulting overlapping area is largely constant at displacement of the conductive surfaces relative to one another up to a threshold value.

The filter more preferably comprises a second embodiment wherein the first conductive surface of the first capacitor and the first conductive surface of the second capacitor are disposed on a first side of the at least one layer of the substrate, the second conductive surface of the first capacitor and the second conductive surface of the second capacitor are disposed on a second side of the at least one layer of the substrate, the first conductive surface of the first capacitor is connected to the second conductive surface of the second capacitor, and the first conductive surface of the second capacitor is connected to the second conductive surface of the first capacitor.

The filter most preferably contains a third embodiment of the electrical circuit arrangement wherein the substrate provides at least two layers wherein, in each case, at least one conductive surface is disposed on the surfaces of the substrate and between at least two layers of the substrate, at least one further conductive surface is disposed between the two conductive surfaces, the further conductive surface is not electrically connected to the at least two surfaces, and the two conductive surfaces and the one further conductive surface not electrically connected to the two conductive surfaces form a capacitor. In this manner, the space requirement of the filter is further reduced by the small structural size of the electrical circuit arrangements. An increased capacitance through the use of the preferred circuit arrangements of the second and third embodiments expands the frequency range of the filter.

The capacitor of the first circuit element is preferably formed by an electrical circuit arrangement according to the third embodiment described above. The capacitor of the second circuit element is preferably formed by an electrical circuit arrangement according to the first embodiment described above. The capacitor of the third circuit element is preferably formed by an electrical circuit arrangement according to the second embodiment described above. This achieves a high capacitance of the second and third circuit element. Furthermore, a highly symmetrical structure can be achieved in this manner.

BRIEF DESCRIPTION OF THE DRAWINGS

The invention is described by way of example below with reference to the drawings, in which advantageous exemplary embodiments of the invention are illustrated. The drawings are as follows:

FIG. 4a shows a lateral view of a multi-layer substrate with metallized surfaces;

FIG. 4b shows an equivalent circuit diagram of the multi-layer substrate from FIG. 4a;

DETAILED DESCRIPTION

Initially, the structure and functioning of various exemplary embodiments of the circuit arrangement according to the invention will be described with reference to FIGS. 1-5. With reference to FIGS. 6-9, the structure and functioning of various exemplary embodiments of the filter according to the invention will then be explained. A repetition of the presentation and description of identical elements in similar drawings has been omitted in some cases.

Figure 1:
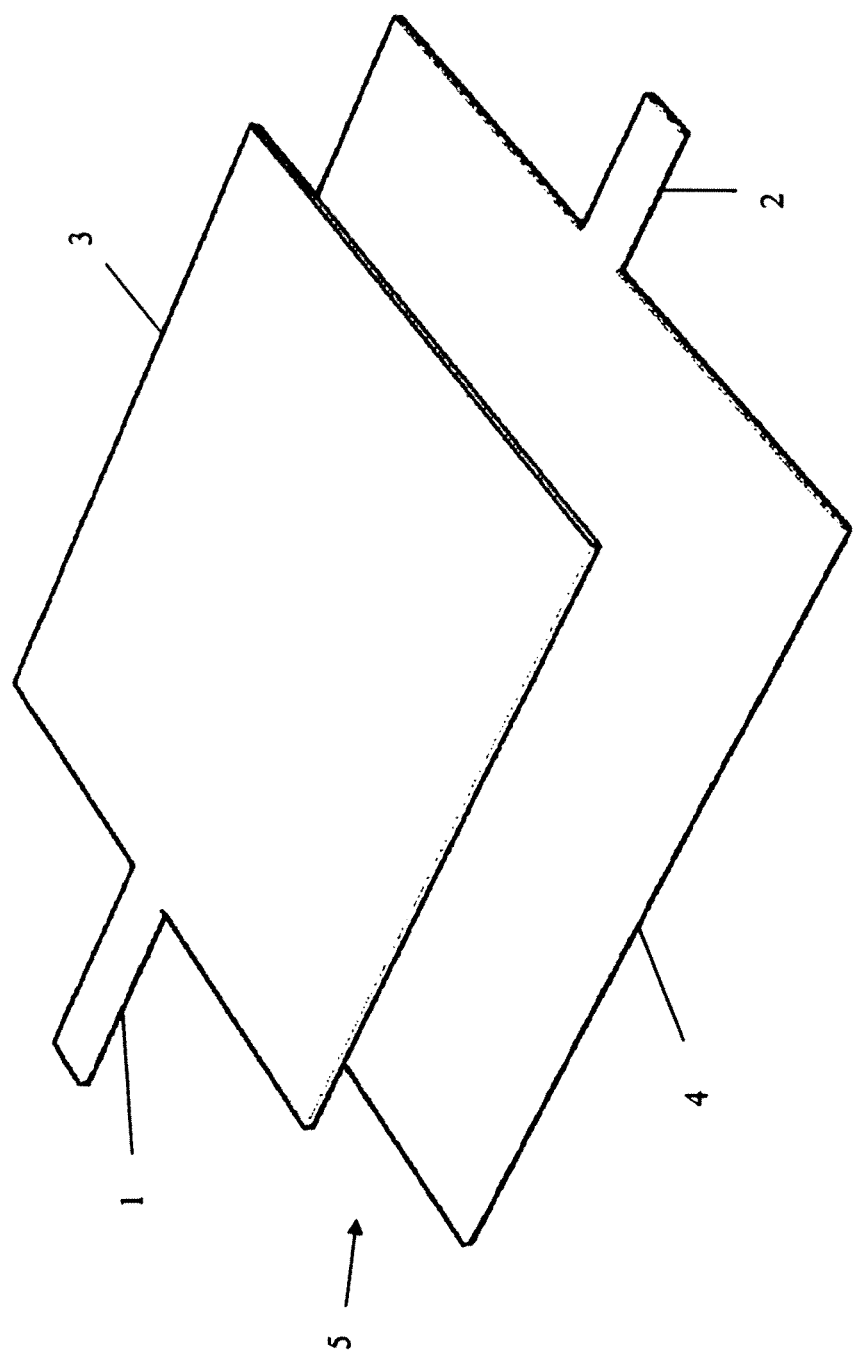
FIG. 1 shows a first exemplary embodiment of the circuit arrangement according to the invention.

FIG. 1 shows a first exemplary embodiment of the circuit arrangement according to the invention. Conductive surfaces 3 and 4 are disposed on both sides of a substrate 5 (shown here as an intermediate space). These are contacted via the connections 1, 2. The conductive surface 3 in this context is smaller in both dimensions than the conductive surface 4. The conductive surface 4 projects over it in both dimensions. Accordingly, an overlapping area of the size of the conductive surface 3 and a part of the connection 1 is formed. If the connection 1 is substantially smaller than the conductive surface 3, it can be ignored with regard to the resulting capacitance. The two conductive surfaces 3, 4 form a plate capacitor and therefore provide a capacitance. If displacements between the conductive surfaces 3, 4 occur as a result of production tolerances, the capacitance does not initially change. Only when the edge of the smaller conductive surface 3 reaches the edge of the larger conductive surface 4, does a change in capacitance begin, because the overlapping area now changes. If the surfaces of the connections are taken into consideration, a slight change in the capacitance may possibly occur even with slight displacements.

Figure 2:
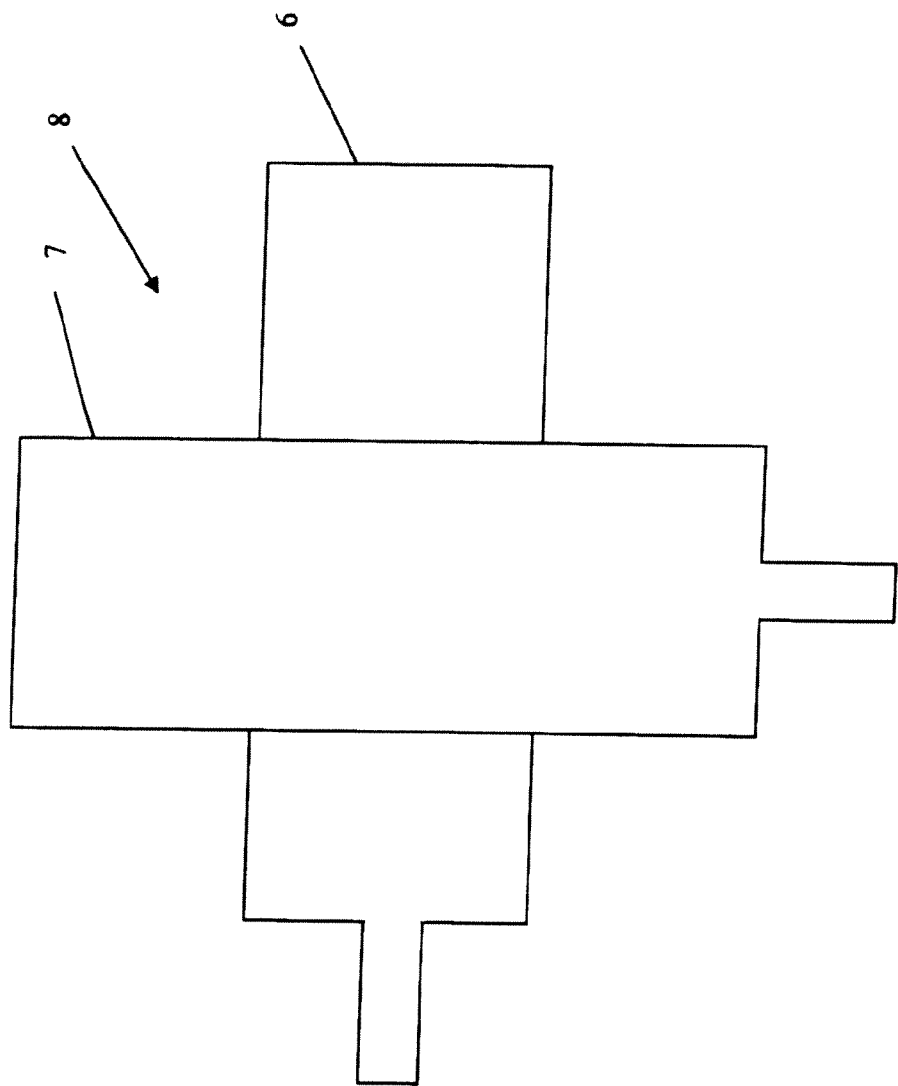
FIG. 2 shows a second exemplary embodiment of the circuit arrangement according to the invention.

In FIG. 2, a second exemplary embodiment of the circuit arrangement according to the invention is presented. The two conductive surfaces 6, 7, which are attached to the two sides of a substrate 8 (illustrated here as transparent), also form an overlapping area. Both conductive surfaces are similar in size. In this context, they are each significantly more extended in one-dimension than in the other. The two surfaces therefore form a cross-shaped structure. The crossover area forms the overlapping area. This shape of the device according to the invention provides a substantially larger displacement range, in which the capacitance does not change significantly, than the structure illustrated in FIG. 1. However, the consequence is also a larger space requirement.

Figure 3:
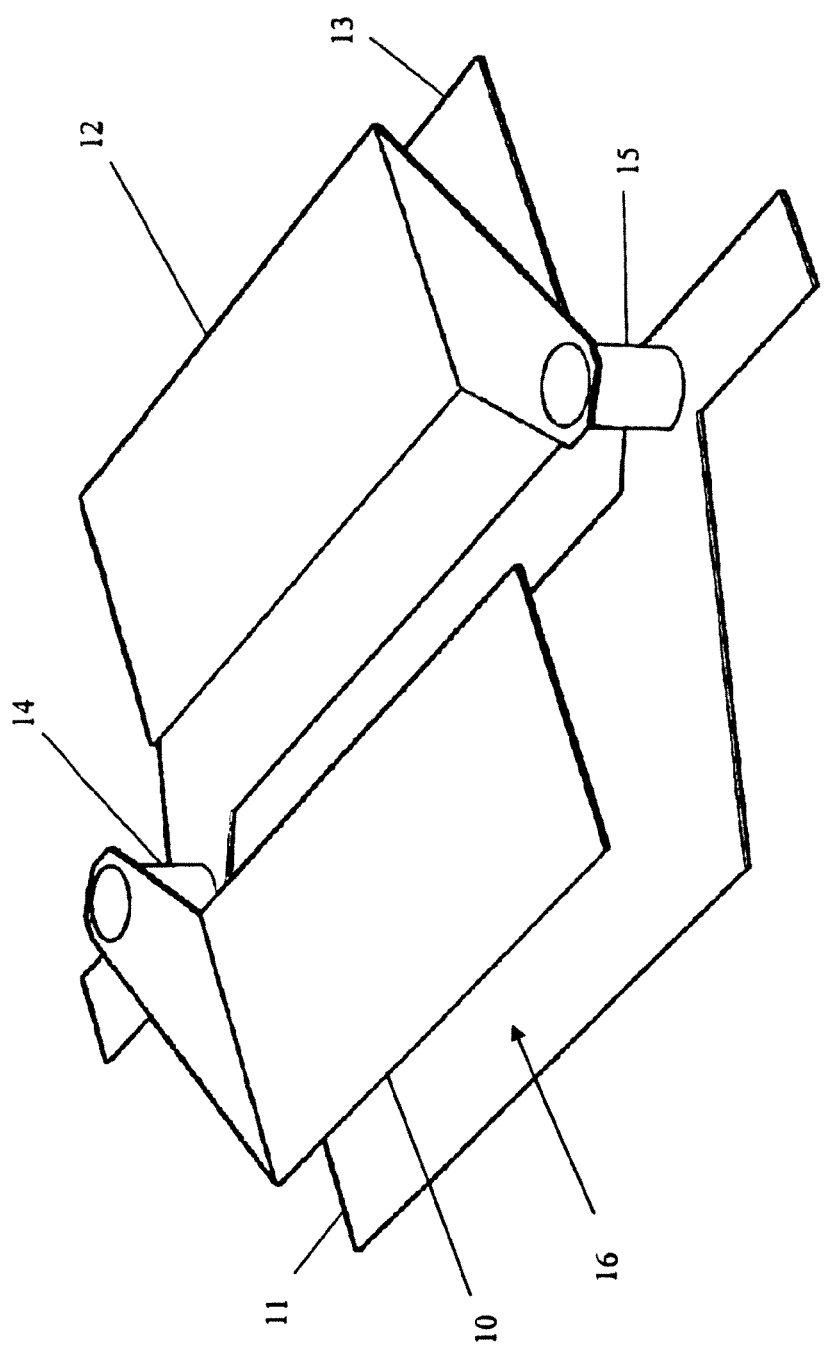
FIG. 3 shows a third exemplary embodiment of the circuit arrangement according to the invention.
Figure 4:
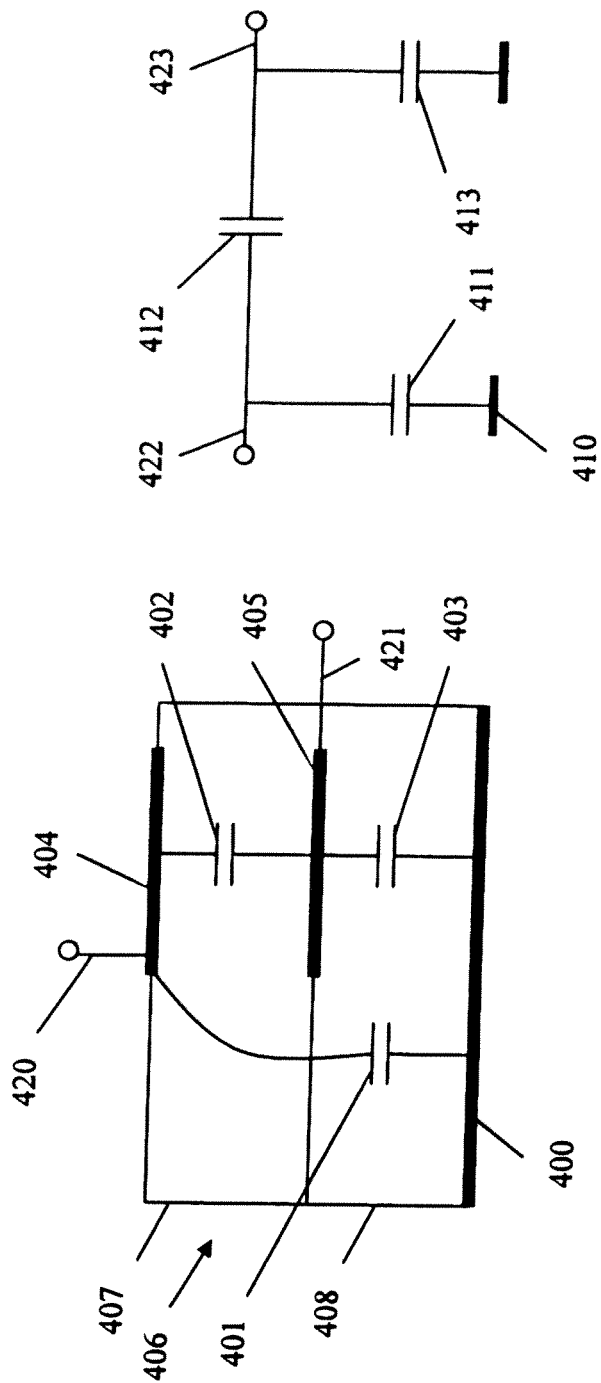

FIG. 3 shows a third exemplary embodiment of the circuit arrangement according to the invention. In each case two conductive surfaces 10, 11, 12, 13 are disposed on both surfaces of a substrate 16 (illustrated here as an intermediate space). The four conductive surfaces 10, 11, 12, 13 form two structures, as shown in FIG. 1. In this context, the opposing conductive surfaces 10 and 11, 12 and 13 each form a structure of this kind and accordingly each form a capacitor. The capacitors are connected in parallel. This is implemented by connecting together respectively two of the conductive surfaces. Accordingly, the conductive surfaces 11 and 12, 10 and 13 are connected to one another in a conductive manner. In this context, the connection is formed by means of conductive through contacts 14, 15 through the substrate 16. Both conductive surfaces 10, 12 on the one side of the substrate 16 are smaller than the conductive surfaces 11, 13 on the other side of the substrate 16. As illustrated with reference to FIG. 1, the overlapping area is therefore constant even in the event of a displacement up to a given size of the displacement. Accordingly, the capacitance of the two parallel-connected capacitors is constant. Parasitic capacitances relative to an earth plane are equal at both connections, because the different parasitic capacitances of the respective conductive surfaces are identical. This effect is explained in greater detail with reference to FIGS. 4a and 4b.

In FIG. 4a, a lateral view of a multi-layer substrate 406 with metallized surfaces 400, 404, 405 is illustrated. The first metallized surface 404 is disposed on the surface of the substrate 406. The second metallized surface 405 is disposed between the two layers 407, 408 of the substrate 406. The underside of the substrate 406 is completely metallized and provides earth potential. The two metallized surfaces form the desired capacitor 402 between the connections 420, 421. Additionally, in each case, they form a parasitic capacitance 401, 403 relative to the metallized substrate underside 400. Since the two metallized surfaces are disposed on different substrate layers and shield one another to some extent, the two parasitic capacitances provide different values. This detracts from the symmetry of the circuit arrangement and is suitable for balanced circuits only to a limited extent.

FIG. 4b shows an equivalent circuit diagram of the multi-layer substrate from FIG. 4a. The desired capacitance 412 is connected between the two connections 422, 423. A parasitic capacitance 411, 413 relative to the earth potential is connected to each connection 422, 423. In the case of the multi-layer substrate illustrated in FIG. 4a, the two parasitic capacitances provide different values. The anti-parallel configuration as shown in FIG. 3 compensates the asymmetry. In the equivalent circuit diagram, largely identical values are obtained for both parasitic capacitances.

Figure 5:
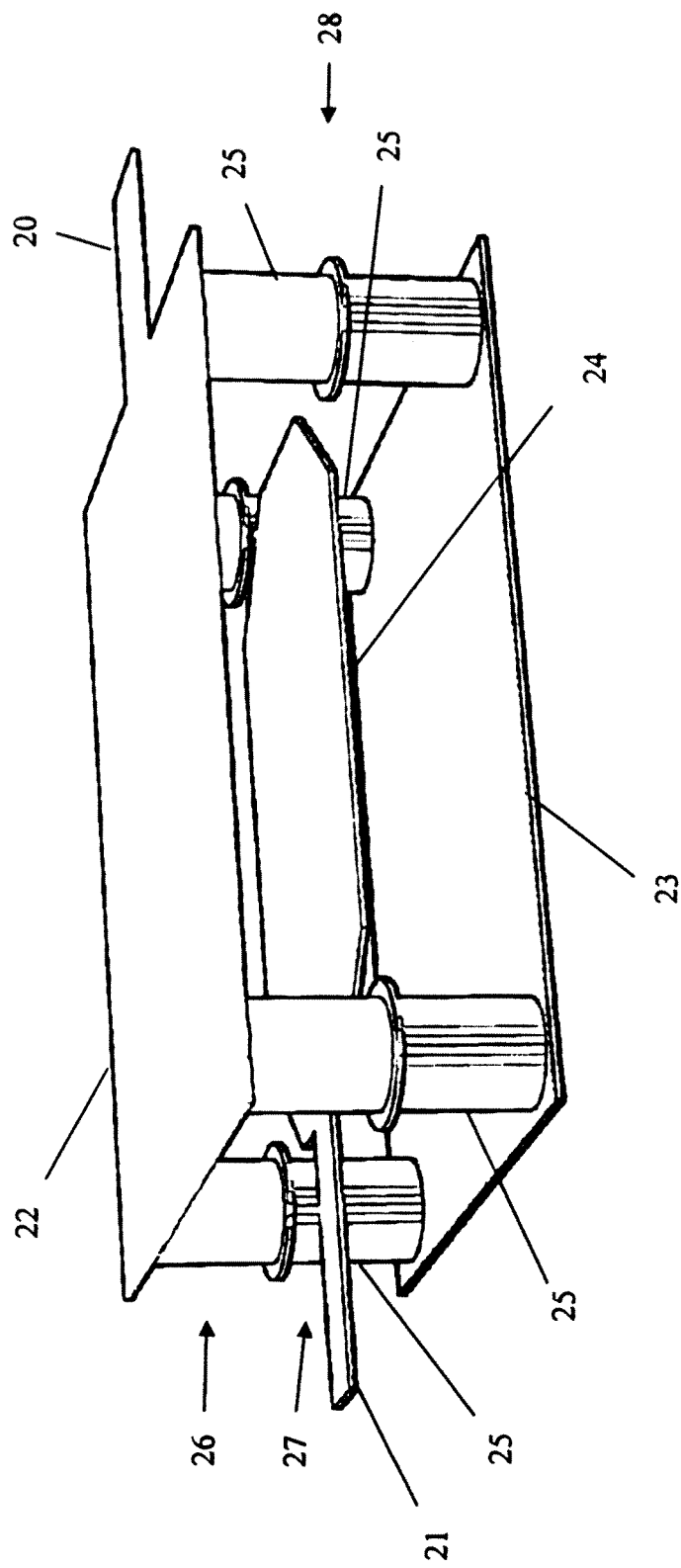
FIG. 5 shows a fourth exemplary embodiment of the circuit arrangement according to the invention.

In FIG. 5, a fourth exemplary embodiment of the circuit arrangement according to the invention is illustrated. The substrate 28 (illustrated here as intermediate spaces) is designed in two layers. In each case, a conductive surface 22, 23 is applied to the two outer surfaces of the substrate 28. A further conductive surface 24 is disposed between the two layers 26, 27 of the substrate 28. The two outer conductive surfaces 22, 23 are connected to one another by means of the conductive through contacts through both layers 26, 27 of the substrate 28 and contacted via the connection 20. The conductive surface 24 disposed between the layers 26, 27 of the substrate 28 is contacted by means of the connection 21. The conductive surfaces 22, 23, 24 form a plate capacitor. Since the inner conductive surface 24 is smaller in both dimensions than the two outer conductive surfaces 22, 23, the effect of the constant overlapping area and accordingly of the constant capacitance in the event of a displacement of the conductive surfaces relative to one another is also provided here.

Figure 6:
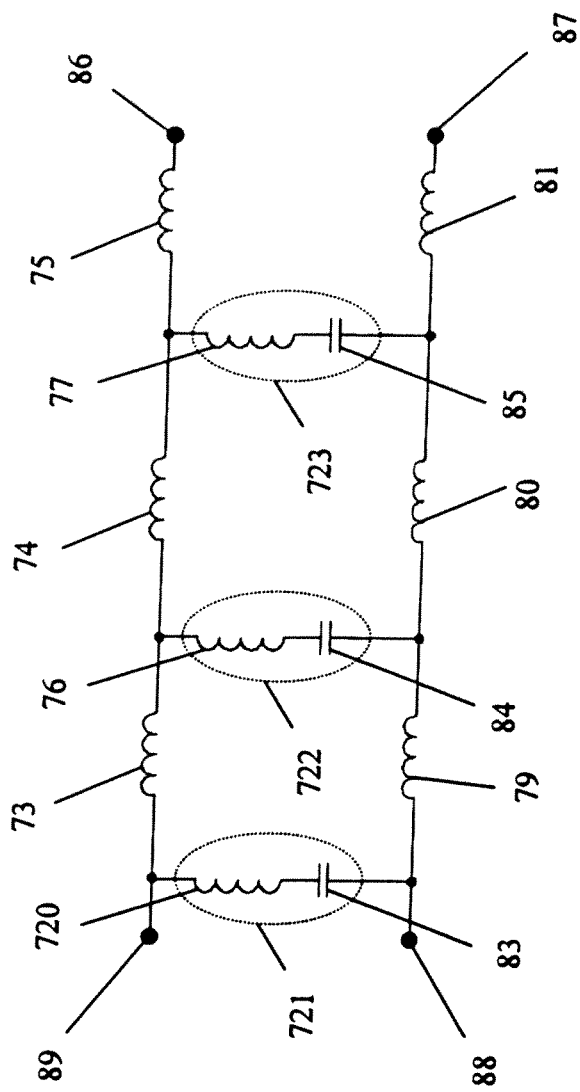
FIG. 6 shows an equivalent circuit diagram of a first exemplary embodiment of the filter according to the invention.

FIG. 6 shows an equivalent circuit diagram of a first exemplary embodiment of the filter according to the invention. This is a balanced (differential) two-port filter with a low-pass characteristic. The connections 88, 89 form the first port of the filter. The connections 86, 87 form the second port of the filter. The filter comprises the parallel connection of three circuit elements by means of inductances 73, 74, 75, 79, 80, 81. The circuit elements in this context each comprise an inductance 720, 76, 77 and a capacitor 83, 84, 85. The first circuit element is connected directly to the first port of the filter. It comprises the inductance 720 and the capacitor 83. The second circuit element is connected in parallel to the first circuit element by means of the inductances 73, 79. It comprises the inductance 76 and the capacitor 84. The third circuit element is connected in parallel to the second circuit element by means of the inductances 74, 80. It comprises the inductance 77 and the capacitor 85. The second port of the filter is connected in parallel to the third circuit element by means of the inductances 75, 81.

Figure 7:
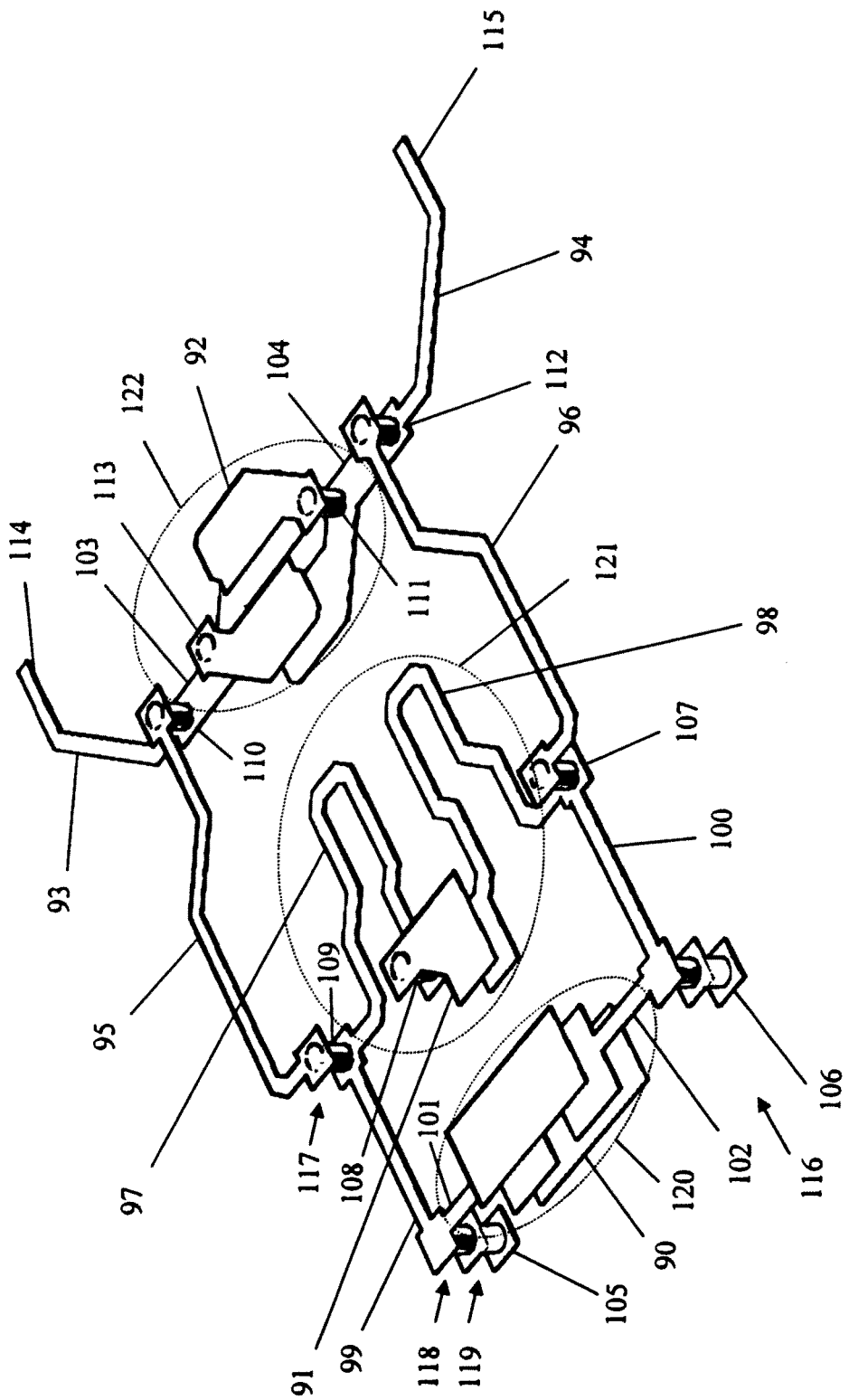
FIG. 7 shows a first exemplary embodiment of the filter according to the invention.

FIG. 7 presents a realization of the first exemplary embodiment of the filter according to the invention as shown in FIG. 6. The filter is presented as a three-dimensional image of the real components. The substrate layers in this context are illustrated as intermediate spaces between the metallized layers. The filter illustrated here corresponds to the equivalent circuit diagram from FIG. 6. The through contacts 105, 106 form the first port of the filter. The ends of the strip conductors 114, 115 form the second port of the filter. Between the two through contacts 105, 106, which form the first port of the filter, a capacitor 90, similar to the capacitor illustrated in FIG. 5, is connected by means of the two strip conductors 101, 102. By contrast with the capacitor from FIG. 5, the capacitor 90 is connected only at the two sides of the divided middle surface. Through contacts are not provided. The conductive surfaces above and below the gap in this context increase the capacitance. The strip conductors 101, 102 each form a small inductance here. The inductances of the first equivalent circuit diagram in this context are always structured in a divided manner in order to preserve symmetry.

The capacitor 90 and the two inductances correspond here to the first circuit element 83 from FIG. 6. By means of the further striplines 99, 100, which also form inductances, a second series circuit of one capacitor 91 and inductances, which are formed by the loop-shaped striplines 97, 98, and form a second circuit element 121, is connected in parallel to the first circuit element 120. The capacitor 91 corresponds to a capacitor as presented in FIG. 1. The through contact 108 is necessary for changing the substrate layer. This structure corresponds to the second circuit element from FIG. 6.

By means of the through contacts 107, 109, a further series circuit of one capacitor 92 and inductances, formed by the striplines 103, 104, which form a third circuit element 122, is connected in parallel by means of two inductances to the second circuit element 121. These inductances are formed by the strip conductors 95, 96 extending in a curved shape. In this context, the capacitor 92 is formed as a structure as illustrated in FIG. 3 and connected via the through contacts 111, 113 to the short strip conductors 103, 104, which form inductances. The second port of the filter is connected via the strip conductors 93, 94, which also form inductances.

Figure 8:
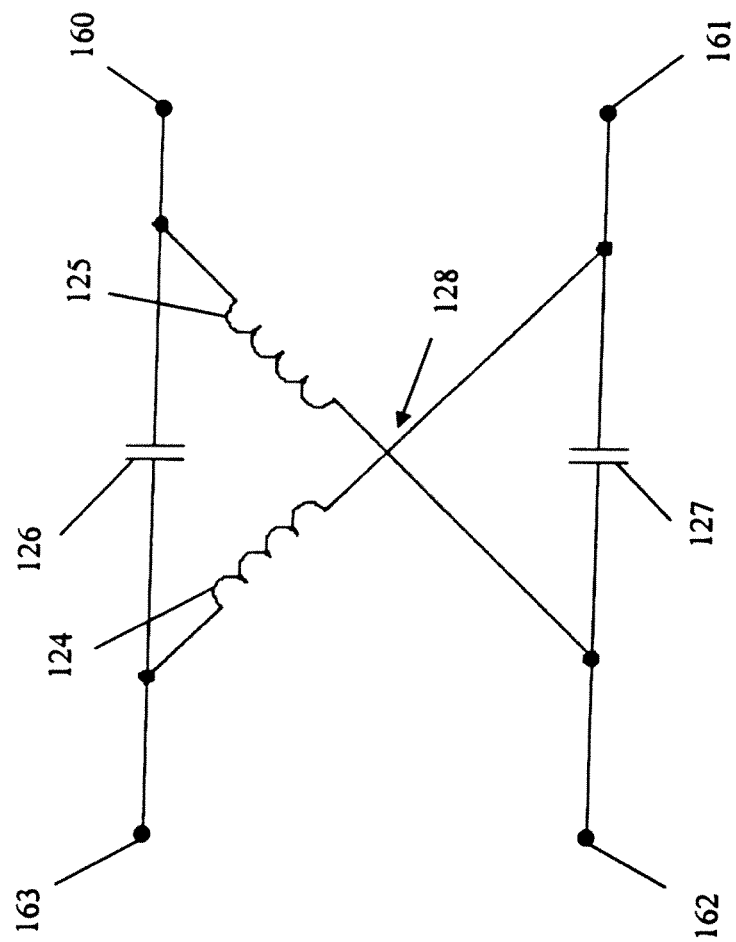
FIG. 8 shows an equivalent circuit diagram of a second exemplary embodiment of the filter according to the invention.

FIG. 8 shows an equivalent circuit diagram of a second exemplary embodiment of the filter according to the invention. The filter shown here is also a balanced (differential) two-port filter. The connections 162 and 163 form the first port of the filter. The connections 160 and 161 form the second port of the filter. The filter is an all-pass filter. This is a filter, which transmits all frequency components with a largely identical strength of attenuation. However, at the same time, a frequency-dependent group delay time ($\tau = -d\phi/d\omega$) is caused. This serves to compensate a phase distortion of the input signal. The two ports of the filter are each connected to two capacitors 126, 127. In this context, the connections 163 and 160 are connected by the capacitor 126. The connections 162 and 161 are connected by the capacitor 127. Furthermore, the ports are connected by the inductances 124, 125. In this manner, the connections 163 and 161 are connected by means of the inductance 124. The connections 160 and 162 are connected by means of the inductance 125. The inductances cross one another at the crossover point 128 without conductive connection.

Figure 9:
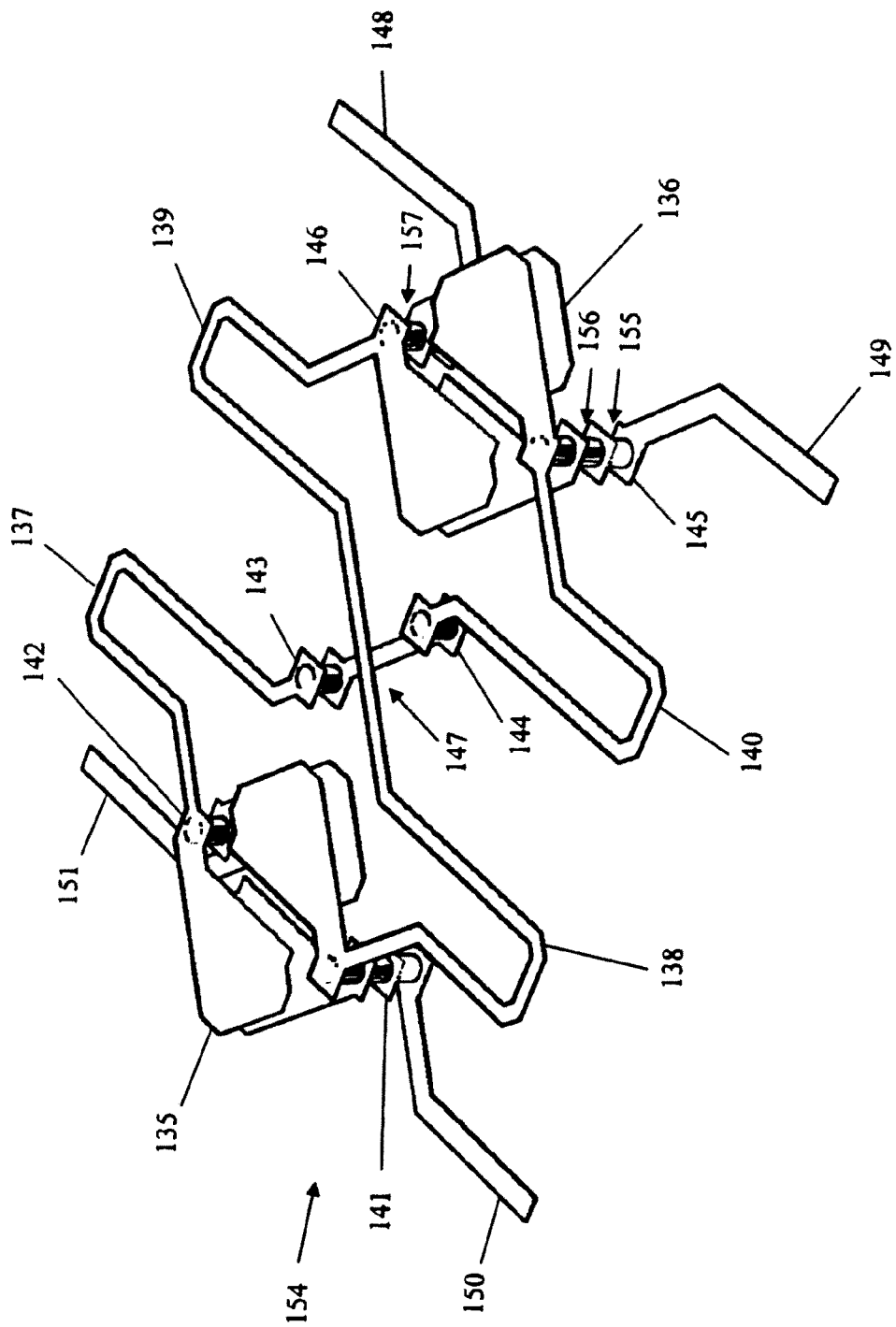
FIG. 9 shows a second exemplary embodiment of the filter according to the invention.

FIG. 9 presents a realization of the second exemplary embodiment of the filter according to the invention as shown in FIG. 8. The filter is presented as a three-dimensional image of the real components. The substrate layers here are presented as intermediate spaces between the metallized layers. The filter illustrated here corresponds to the equivalent circuit diagram from FIG. 8. The strip conductors 149, 150 form the first port of the filter. The strip conductors 148, 151 form the second port of the filter. By means of the through contacts 141, 142, the two strip conductors 150, 151 are connected through the capacitor 135.

The capacitor 135 corresponds to a structure, as shown in FIG. 3. By means of the through contacts 145, 146, the two strip conductors 149, 148 are connected through the capacitor 136. The capacitor 136 corresponds to a structure as shown in FIG. 3. Furthermore, the two strip conductors 150, 148 are connected by means of the through contacts 141, 146 through the strip conductors 138, 139, which form inductances. The two strip conductors 151, 149 are connected by means of the through contacts 142, 145 through the strip conductors 137, 140, which form inductances. The strip conductors 137, 138, 139, 140 are formed here in a loop shape. The strip conductors 138, 139 and 137, 140 cross one another in this context at a crossover point 147. The crossover is realized by means of the through contacts 143, 144. Accordingly a crossover is possible without conductive connection. The strip conductors 137, 138, 139, 140 here provide largely the same size. The capacitors 135, 136 in this context also provide largely the same size. The filter is structured in a largely symmetrical manner. As a result of the symmetry, the filter achieves very good high-frequency properties.

The invention is not restricted to the exemplary embodiment illustrated. As already mentioned, substrates with a different number of layers can be used to form the capacitors. Different substrate materials can also be used in this context. In particular, a use of materials with a very high $\in_R$ is conceivable in order further to enlarge the capacitances. Similarly, filters of different transmission functions and different phase behavior are conceivable. All of the features described above or illustrated in the drawings can be advantageously combined with one another within the framework of the invention.

The invention claimed is:

1. A filter with at least one electrical circuit arrangement comprising a substrate and at least two conductive surfaces, wherein
   the substrate comprises at least one layer,
   the at least one layer of the substrate is disposed between the at least two conductive surfaces,
   the at least two conductive surfaces form a first capacitor,
   the at least two conductive surfaces at least partly overlap and form an overlapping area, and
   the overlapping area is largely constant at displacement of the at least two conductive surfaces relative to one another up to a threshold value, wherein
   the filter contains a first inductance,
   the first inductance is concentrated,
   the first inductance is realized as a conductive strip on the substrate,
   the conductive strip, which forms the first inductance, provides a curve and/or is arranged in the form of a loop and/or a spiral, and
   the filter is a differential two-port filter that provides an all-pass characteristic and generates a phase distortion.

2. The filter according to claim 1, wherein
   the substrate comprising at least one layer provides several layers,
   the several layers are connected by conductive through contacts, and
   the filter extends over the several substrate layers.

3. The filter according to claim 1, wherein the at least two conductive surfaces are formed by metallization.

4. The filter according to claim 1, wherein at least one axis is centered through the filter, and the filter is structured in a largely symmetrical manner relative to the at least one axis.

5. The filter according to claim 1, wherein one of the at least two conductive surfaces has at least one smaller dimension than another one of the at least two conductive surfaces and thus is overlapped in the at least one dimension on two sides thereof by the another one of the at least two conductive surfaces.

6. The filter according to claim 1, wherein the filter comprises several inductances connected in parallel by the first capacitor and/or further capacitors.

7. The filter according to claim 1, wherein
   the filter comprises the first inductance and a second inductance connected in parallel by the first capacitor and a second capacitor,
   the first and second inductances are arranged in a crossover manner, and
   the crossover is implemented by conductive through contacts through the at least one layer of the substrate.

8. The filter according to claim 7, wherein
   the first inductance is connected to a first connection and to a fourth connection,
   the second inductance is connected to a second connection and to a third connection,
   the first capacitor is connected to the first connection and the second connection, and
   the second capacitor is connected to the third connection and the fourth connection.

9. The filter according to claim 8, wherein
   a first port of the filter is connected to the first connection and to the third connection,
   a second port of the filter is connected to the second connection and to the fourth connection.

10. The filter according to claim 1, wherein one of the at least two conductive surfaces has two smaller dimensions than another one of the at least two conductive surfaces and thus is overlapped in said two dimensions on two sides thereof by the another one of the at least two conductive surfaces.

11. The filter according to claim 1, wherein the substrate comprising at least one layer is a multi-layer substrate, and the multiple layers of the substrate are connected by at least one electrically conductive through contact.

12. The filter according to claim 1, wherein at least one axis is centered through the at least one electrical circuit arrangement, and the at least one electrical circuit arrangement is structured in a symmetrical manner relative to the at least one axis.

13. The filter according to claim 1, wherein the substrate is a ceramic substrate or a dielectric printed circuit board.

14. The filter according to claim 1, wherein
   the substrate comprising at least one layer provides at least two layers,
   the at least two conductive surfaces are disposed on the surfaces of the substrate,
   at least one further conductive surface is disposed between the at least two conductive surfaces,
   the further conductive surface is not conductively connected to the at least two conductive surfaces, and
   the at least two conductive surfaces and the one further conductive surface not conductively connected to the two conductive surfaces form a plate capacitor.

15. A filter with at least one electrical circuit arrangement comprising a substrate and at least two conductive surfaces, wherein
   the substrate comprises at least one layer,
   the at least one layer of the substrate is disposed between the at least two conductive surfaces,
   the at least two conductive surfaces form a first capacitor,
   the at least two conductive surfaces at least partly overlap and form an overlapping area and
   the overlapping area is largely constant at displacement of the at least two conductive surfaces relative to one another up to a threshold value, wherein
   the filter contains a first inductance,
   the first inductance is concentrated,
   the first inductance is realized as a conductive strip on the substrate,
   the conductive strip, which forms the first inductance, provides a curve and/or is arranged in the form of a loop and/or a spiral, and
   the filter is a differential two-port filter that provides a low-pass characteristic.

16. The filter according to claim 15, wherein
   the filter comprises several circuit elements connected in parallel by parallel inductances,
   the several circuit elements each comprise series circuits of inductances and a capacitor and/or further capacitors, and
   each capacitor and/or the further capacitors is or are formed by the electrical circuit arrangement.

17. The filter according to claim 16, wherein
a first port of the filter is connected to a first circuit element,
a second circuit element is connected to the first circuit element by a first pair of the parallel inductances,
a third circuit element is connected to the second circuit element by a second pair of the parallel inductances,
a second port of the filter is connected to the third circuit element by a third pair of the parallel inductances.

18. The filter according to claim 17, wherein
the capacitor of the first circuit element is smaller than the capacitors of the second and third circuit elements, and
the inductances of the second circuit element are larger than the inductances of the first and third circuit elements.

19. The filter according to claim 15, wherein
the substrate comprising at least one layer provides at least two layers,
the at least two conductive surfaces are disposed on the surfaces of the substrate,
at least one further conductive surface is disposed between the at least two conductive surfaces,
the further conductive surface is not conductively connected to the at least two conductive surfaces, and
the at least two conductive surfaces and the one further conductive surface not conductively connected to the two conductive surfaces form a plate capacitor.

20. The filter according to claim 15, wherein the substrate is a ceramic substrate or a dielectric printed circuit board.

21. The filter according to claim 15, wherein at least one axis is centered through the at least one electrical circuit arrangement, and the at least one electrical circuit arrangement is structured in a symmetrical manner relative to the at least one axis.

22. The filter according to claim 15, wherein the substrate comprising at least one layer is a multi-layer substrate, and the multiple layers of the substrate are connected by at least one electrically conductive through contact.

23. The filter according to claim 15, wherein one of the at least two conductive surfaces has two smaller dimensions than another one of the at least two conductive surfaces and thus is overlapped in said two dimensions on two sides thereof by the another one of the least two conductive surfaces.

24. The filter according to claim 15, wherein one of the at least two conductive surfaces has at least one smaller dimension than another one of the at least two conductive surfaces and thus is overlapped in the at least one dimension on two sides thereof by the another one of the at least two conductive surfaces.

25. The filter according to claim 15, wherein
the substrate comprising at least one layer provides several layers,
the several layers are connected by conductive through contacts, and
the filter extends over the several substrate layers.

26. The filter according to claim 15, wherein at least one axis is centered through the filter, and the filter is structured in a largely symmetrical manner relative to the at least one axis.

27. The filter according to claim 15, wherein the at least two conductive surfaces are formed by metallization.

\* \* \* \* \*